(12) United States Patent
Ni et al.

(10) Patent No.: US 6,257,168 B1
(45) Date of Patent: Jul. 10, 2001

(54) ELEVATED STATIONARY UNIFORMITY RING DESIGN

(75) Inventors: Tuqiang Ni; Wenli Collison, both of Fremont, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 09/346,564

(22) Filed: Jun. 30, 1999

(51) Int. Cl.[7] .............................. C23C 16/00; C23F 1/02
(52) U.S. Cl. .................. 118/723 R; 156/345; 118/728
(58) Field of Search ............................... 118/728, 723 R, 118/723 AN, 733 E, 715, 723 E; 156/345

(56) References Cited

U.S. PATENT DOCUMENTS

| | | |
|---|---|---|
| 5,552,124 | 9/1996 | Su ........................................ 156/345 |
| 5,660,673 * | 8/1997 | Miyoshi . |
| 5,900,064 * | 5/1999 | Kholodenko ..................... 118/723 R |
| 5,904,799 * | 5/1999 | Donohoe . |
| 5,919,332 * | 7/1999 | Koshiishi et al. . |

FOREIGN PATENT DOCUMENTS

| | | | |
|---|---|---|---|
| 660499 * | 6/1995 | (EP) . | |
| 0676790A1 | 11/1995 | (EP) . | |
| 09055374 * | 2/1997 | (EP) . | |
| 786804 * | 7/1997 | (EP) . | |
| 99/14788 * | 3/1999 | (WO) . | |
| 99/14796 * | 3/1999 | (WO) . | |

* cited by examiner

Primary Examiner—Gregory Mills
Assistant Examiner—Luz L. Alejandro
(74) Attorney, Agent, or Firm—Beyer Weaver & Thomas, LLP

(57) ABSTRACT

A plasma processing reactor for processing a semiconductor substrate is disclosed. The apparatus includes a chamber. Additionally, the chamber includes a bottom electrode that is configured for holding the substrate. The apparatus further includes a stationary uniformity ring that is configured to surround the periphery of the substrate. Furthermore, the stationary uniformity ring is coupled to a portion of the chamber and disposed above the bottom electrode in a spaced apart relationship to form a vertical space above the bottom electrode. Further, the vertical space is configured to provide room for ingress and egress of the substrate. Also, the stationary uniformity ring has a thickness that substantially reduces diffusion of a first species from outside the stationary uniformity ring toward an edge of the substrate.

28 Claims, 5 Drawing Sheets

ELEVATED STATIONARY UNIFORMITY RING DESIGN

BACKGROUND OF THE INVENTION

The present invention relates to the fabrication of semiconductor integrated circuits (IC's). More particularly, the present invention relates to improved methods and apparatuses for controlling the amount of neutral reactants delivered to a substrate during processing of the substrate.

During the manufacture of a semiconductor-based product, for example, a flat panel display or an integrated circuit, multiple deposition and/or etching steps may be employed. By way of example, one method of etching is plasma etching. In plasma etching, a plasma is formed from the ionization and dissociation of process gases. The positively charged ions are accelerated towards the substrate where they, in combination with neutral reactants, drive the etching reactions. In this manner, etched features such as vias, contacts, or trenches may be formed in the layers of the substrate.

One particular method of plasma etching uses an inductive source to generate the plasma. FIG. 1 illustrates a prior art inductive plasma processing reactor 100 that is used for plasma etching. A typical inductive plasma processing reactor includes a chamber 102 with an antenna or inductive coil 104 disposed above a dielectric window 106. Typically, antenna 104 is operatively coupled to a first RF power source 108. Furthermore, a gas port 110 is provided within chamber 102 that is arranged for releasing gaseous source materials, e.g., the etchant source gases, into the RF-induced plasma region between dielectric window 106 and a substrate 112. Substrate 112 is introduced into chamber 102 and disposed on a chuck 114, which generally acts as a bottom electrode and is operatively coupled to a second RF power source 116.

In order to create a plasma, a process gas is input into chamber 102 through gas port 110. Power is then supplied to inductive coil 104 using first RF power source 108, and a large electric field is produced inside chamber 102. The electric field accelerates the small number of electrons present inside the chamber causing them to collide with the gas molecules of the process gas. These collisions result in ionization and initiation of a discharge or plasma 118. As is well known in the art, the neutral gas molecules of the process gas when subjected to these strong electric fields lose electrons, and leave behind positively charged ions. As a result, positively charged ions 120 and negatively charged electrons 122 are contained inside plasma 118. Furthermore, neutral gas molecules 124 (and/or atoms) are contained inside plasma 118 and throughout chamber 102.

Once the plasma has been formed, neutral gas molecules 124 inside the plasma are directed towards the surface of the substrate by diffusion, i.e., the random movement of molecules inside the chamber. In this manner, a layer of neutral reactants 126 (e.g., neutral gas molecules) is typically formed along the surface of substrate 112. Correspondingly, when bottom electrode 114 is powered, ions 120 tend to accelerate towards the substrate where they, in combination with neutral reactants 126, activate the etching reaction. As can be appreciated by those skilled in the art, there are many different types of processes that use varying amounts of ions and neutral reactants to complete the etch. By way of example, in a neutral reactants driven process, the plasma is required to contain a greater concentration of neutral reactants to accelerate the reaction. On the other hand, in ion driven processes, the plasma is required to contain a greater concentration of ions to accelerate the reaction.

One problem that has been encountered with both neutral reactants driven processes and ion driven processes has been a non-uniform etch rate. For example, one area of the substrate may be etched at a faster rate than another area. In neutral reactants driven processes, and while not wishing to be bound by theory, it is believed that there is a greater concentration of neutral reactants at the edge of the substrate and therefore the edge gets etched at a faster rate. Referring back to FIG. 1, the density of neutral reactants 126 is greater in regions 130 because they are disposed above a portion of the bottom electrode and therefore do not get consumed as readily as neutral reactants disposed above a portion of the substrate.

Furthermore, a non-uniform etch rate may lead to device failure in the semiconductor circuit. By way of example, a non-uniform etch may cause undercutting in the side walls of a trench. Typically, undercutting reduces the thickness of the conducting line or in some cases causes line breakage, which may lead to device failure. Still further, non-uniformity etching generally adds time to the etching process, which reduces substrate throughput.

One approach to achieving a uniform etch has been to provide a uniformity ring inside the plasma reactor. Broadly speaking, the uniformity ring is designed to surround the substrate with a wall that blocks a portion of the neutral reactants, in particular the neutral reactants located in the high density neutral reactants area, from diffusing into the substrate. In this manner, a more uniform etch may be achieved because the neutral reactants at the edge of the substrate are prevented from interacting with the substrate. Furthermore, in order to allow the ingress and egress of the substrate, the uniformity ring has been configured to move up and down.

Referring to FIGS. 2A & 2B, a movable uniformity ring 202 is shown in conjunction with plasma processing chamber 100 of FIG. 1. FIG. 2A shows the movable uniformity ring 202 in a down position, and FIG. 2B shows the movable uniformity ring 202 in an up position. For the most part, when the movable uniformity ring 202 is in the down position, neutral reactants 204 near the edge of a substrate 206 are substantially blocked from diffusing into the edge of the substrate 206, and when the movable uniformity ring 202 is in the up position, a space 210 between the uniformity ring 202 and the bottom electrode 208 is provided for the ingress and egress of the substrate 206.

However, moving the uniformity ring has its drawbacks. Typically, moving structures that are placed above the substrate during processing tend to cause contamination of the substrate. This is because such structures present surfaces for depositing etch by-products (e.g., polymers) and when the uniformity ring is moved, the deposits may flake off onto the substrate, causing particle contamination. Particle contamination may produce undesirable and/or unpredictable results. For example, particles on the substrate surface may block a portion of the substrate that needs to be etched. In this manner, a trench may not be formed properly and this may lead to device failure and therefore a reduction in productivity. Additionally, the bottom electrode may be configured to move up and down with the same result.

Another approach to achieving a uniform etch has been to provide a stationary uniformity ring with a slit. The slit is typically configured for the egress and ingress of the substrate. However, the slit has its drawbacks. For the most part, the slit is only configured on one side of the uniformity ring or in only a portion of the uniformity ring and therefore the species are not distributed evenly around the substrate during processing. That is, one area of the substrate is in contact with a greater amount of reactive species than another area. This tends to produce a non-uniform etch rate. Furthermore, the slit produces more corners and surface area, which tend to provide surfaces for depositing material. This generally makes it difficult to clean and contributes to increased contamination. Additionally, openings in the uniformity ring are difficult to manufacture, especially with the materials that are generally used to form the uniformity ring.

In view of the foregoing, there are desired improved methods and apparatuses for obtaining a more uniform etch rate, using a uniformity ring to control the amount of reactants delivered to a substrate, while providing the ingress and egress of the substrate, and without moving the uniformity ring or producing a non-symmetrical flow pattern near the uniformity ring.

SUMMARY OF THE INVENTION

The invention relates, in one embodiment, to a plasma processing reactor for processing a semiconductor substrate. The apparatus includes a chamber. Additionally, the chamber includes a bottom electrode that is configured for holding the substrate. The apparatus further includes a stationary uniformity ring that is configured to surround the periphery of the substrate. Furthermore, the stationary uniformity ring is coupled to a portion of the chamber and disposed above the bottom electrode in a spaced apart relationship to form a vertical space above the bottom electrode. Further, the vertical space is configured to provide room for ingress and egress of the substrate. Also, the stationary uniformity ring has a thickness that substantially reduces diffusion of a first species from outside the stationary uniformity ring toward an edge of the substrate.

In a further embodiment, the vertical space is configured for removing etched by-products produced during processing. Additionally, the inner peripheral surface of the stationary uniformity ring is spaced apart from the periphery of the substrate. Moreover, the outer peripheral surface of said uniformity ring is tapered, wherein the taper provides a diffusion barrier that reduces the amount of the first species delivered to the edge of the substrate during processing by directing a portion of the first species in a direction away from the edge of the substrate. Also, the stationary uniformity ring is positioned in said spaced apart relationship by a support mechanism that is disposed substantially outside an exhaust path of by-products formed during processing.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION OF PREFERRED EMBODIMENTS

Figure 1:
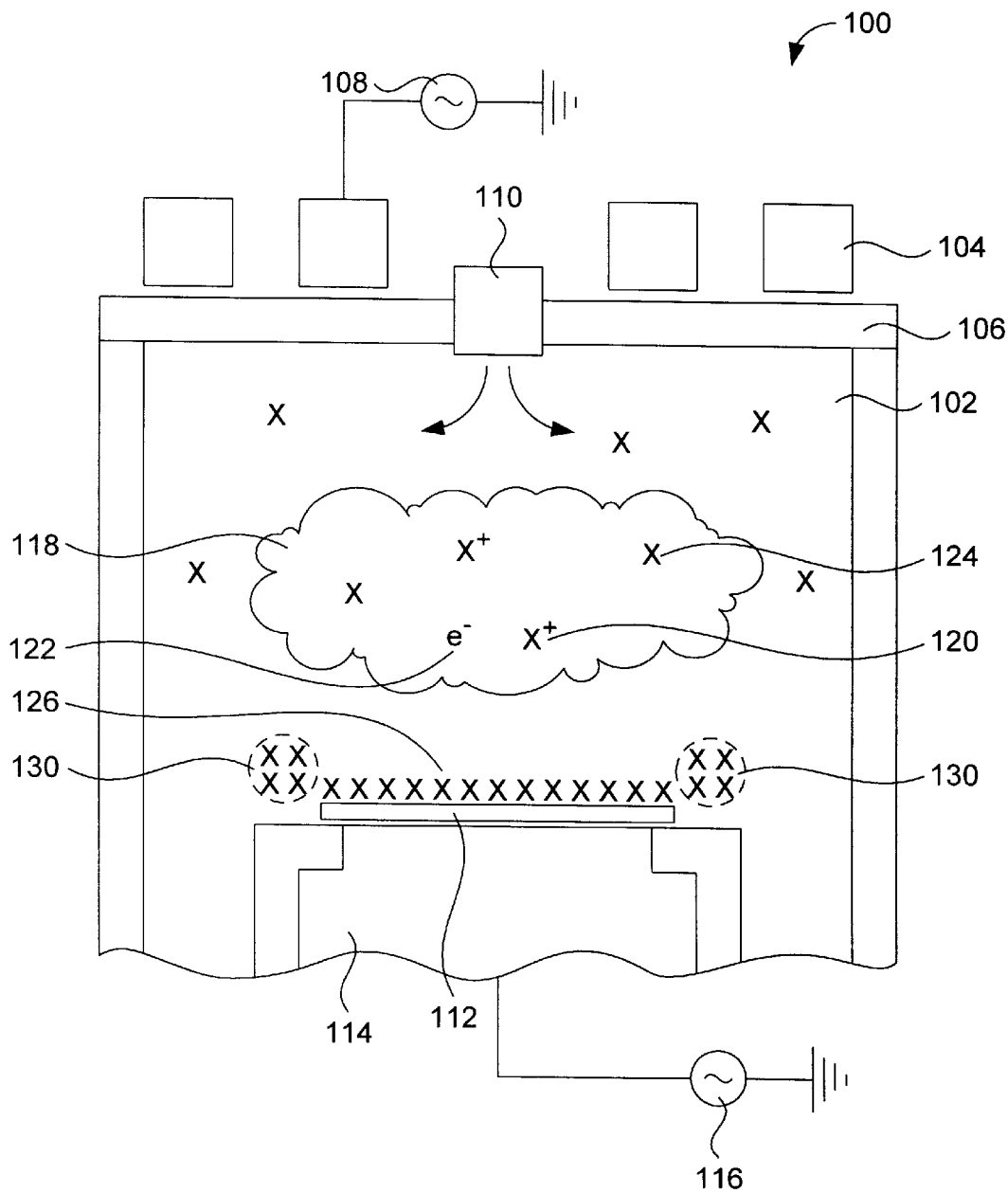
FIG. 1 is a schematic diagram of a prior art inductive plasma processing reactor.
Figure 2A:
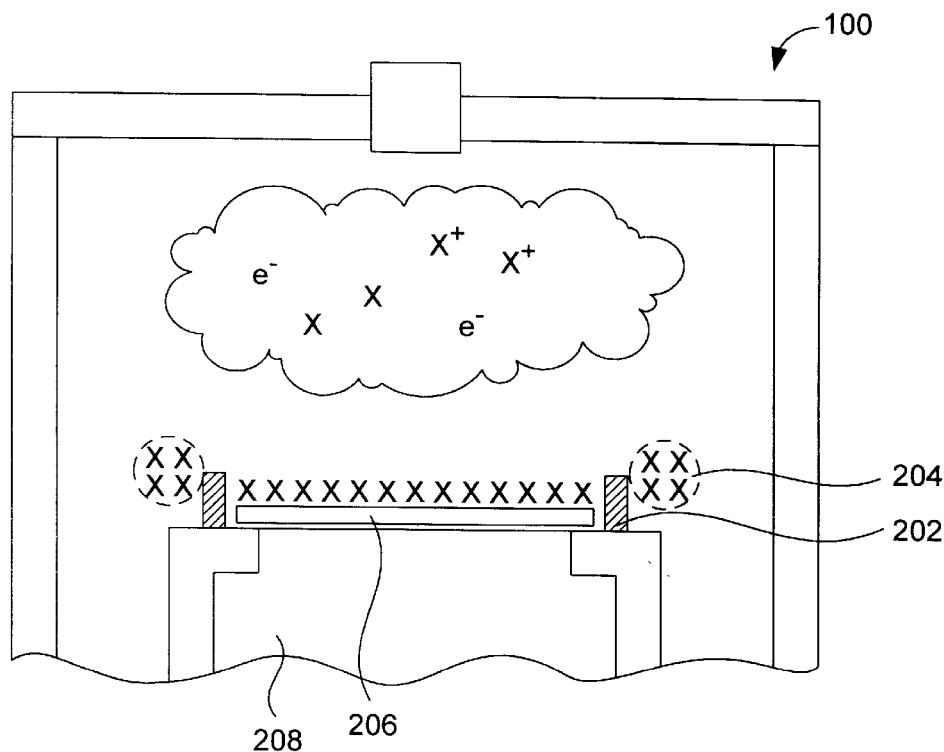
FIG. 2A is a schematic diagram of a prior art inductive plasma processing reactor with a moving uniformity ring in the down position.
Figure 2B:
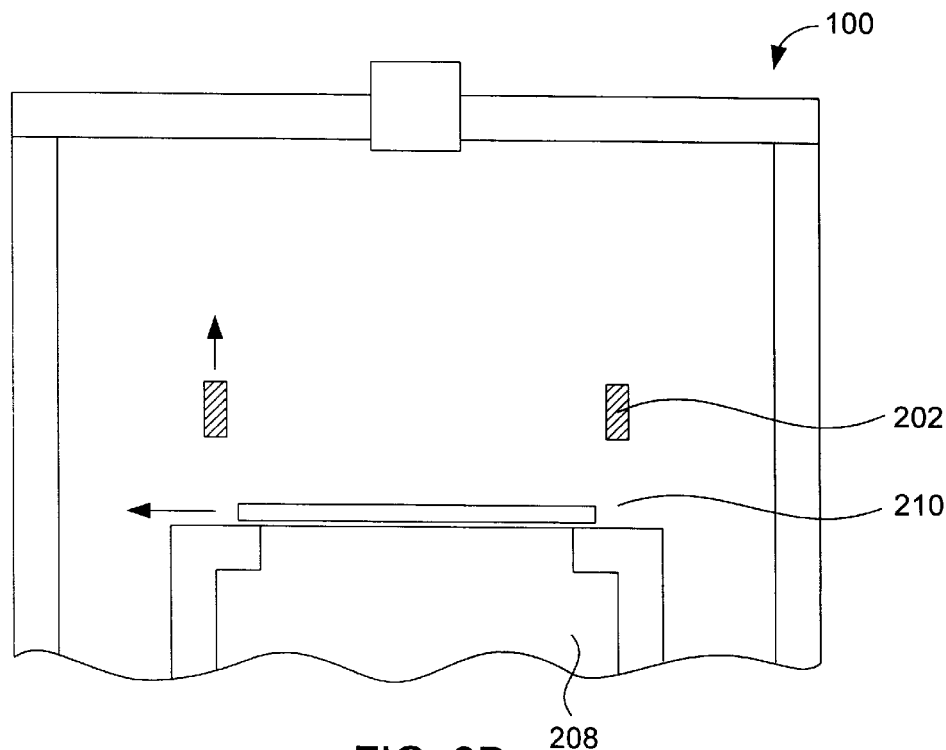
FIG. 2B is a schematic diagram of a prior art inductive plasma processing reactor with a moving uniformity ring in the up position.

The present invention will now be described in detail with reference to a few preferred embodiments thereof as illustrated in the accompanying drawings. In the following description, numerous specific details are set forth in order to provide a thorough understanding of the present invention. It will be obvious, however, to one skilled in the art, that the present invention may be practiced without some or all of these specific details. In other instances, well known process steps have not been described in detail in order not to unnecessarily obscure the present invention.

The present invention provides a uniformity ring for controlling the amount of species distributed to a substrate during processing. The uniformity ring is stationary with respect to the plasma processing chamber and is disposed above the bottom electrode in a spaced apart relationship. The spaced apart relationship provides both a space for substrate transfer (e.g., ingress and egress) and a gap for the removal of by-products that are formed during etching. The uniformity ring also includes an opening that is configured for directing a species towards the bottom electrode. Furthermore, the uniformity ring is configured with a substantial wall thickness and/or taper that helps control the amount of species distributed to a substrate during processing.

In accordance with one aspect of the present invention, uniform etch rates for etched features on a substrate during etching are achieved by introducing a uniformity ring into a plasma processing reactor. The term "etched features" herein encompasses e.g., trenches, contacts, vias or the like. The etching takes place while the substrate is disposed on a chuck within the plasma processing chamber. A process gas, which is input into a plasma processing chamber, is energized with RF power supplied to an electrode wherein the RF energy dissociates the gas thereby creating a plasma.

Following the creation of the plasma, the neutral species inside the chamber are moved to the surface of the substrate by diffusion (or convection). Power is then supplied to the lower electrode and the ions are accelerated towards the substrate. The accelerated ions and the neutral reactants at the surface of the substrate react with materials disposed on the substrate surface and therefore etch the substrate. In general, when the density of the neutral reactants is high at the edge of the substrate, a non-uniform etch between the center and edge of the substrate is produced. By introducing a uniformity ring above the bottom electrode and surrounding the periphery of the substrate, neutral reactants around the edge of the substrate are substantially blocked from reacting with the edge of the substrate. The decrease in neutral reactants density proximate the edge of the substrate tends to produce a more uniform etch.

In accordance with another aspect of the present invention, the uniformity ring is arranged to be stationary with respect to the plasma processing chamber. By being stationary, the uniformity ring reduces particle contamination associated with a moving uniformity ring.

In accordance with another aspect of the present invention, the uniformity ring is evenly disposed above the bottom electrode in a spaced apart relationship. In one embodiment, the spaced apart relationship provides a space for the ingress and egress of the substrate. In another embodiment, the space is further configured for removing etched by-products produced during processing. Furthermore, by placing the uniformity ring evenly across the bottom electrode, a symmetrical space is formed, and therefore a more uniform etch can be achieved (e.g., the center and the edge of the substrate have substantially the same etch rates).

In accordance with another aspect of the present invention, the uniformity ring is dimensioned to substantially prevent diffusion of neutral reactants that are proximate the edge of the substrate. By reducing the amount of species proximate to the edge of the substrate, a more uniform etch can be achieved. In one embodiment, the uniformity ring is configured to have a thickness that substantially prevents diffusion of neutral reactants toward the substrate edge and through the space provided by the spaced apart relationship. In another embodiment, the outer peripheral surface of the uniformity ring is tapered. The taper is configured to provide a diffusion barrier that reduces the amount of species delivered to the edge of the substrate by directing a portion of the species in a direction away from the edge of the substrate.

Figure 3:
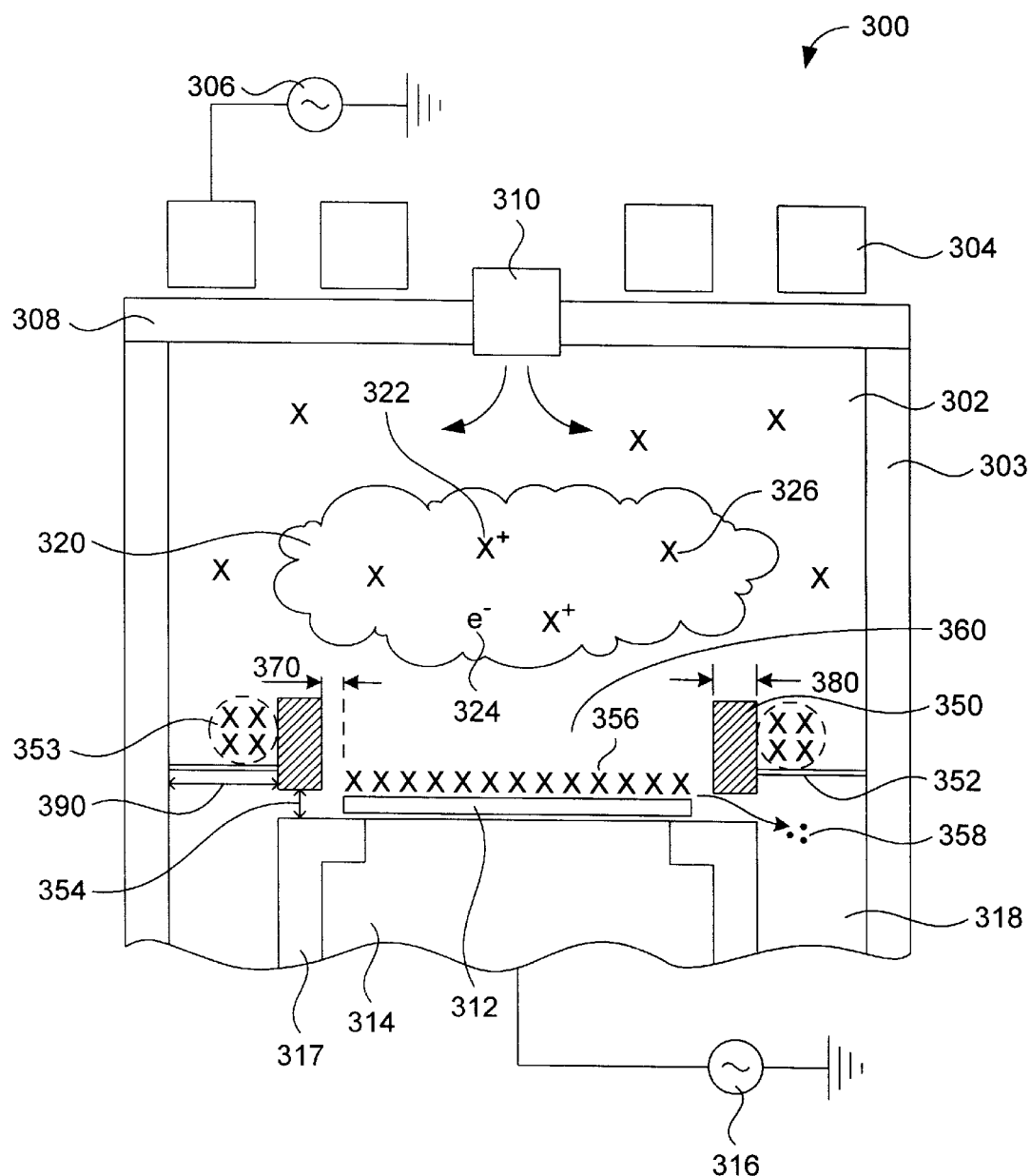
FIG. 3 is a schematic diagram of an inductive plasma processing reactor with a stationary uniformity ring that has a spaced apart relationship with the bottom electrode, in accordance with one embodiment of the present invention.

In a preferred embodiment, the present invention is practiced in a high density plasma reactor, such as an inductively coupled plasma reactor based on the technology of the TCP™ 9600 plasma reactor, which is available from Lam Research Corporation of Fremont, Calif. FIG. 3 illustrates a simplified schematic of the inductively coupled plasma reactor. Plasma reactor 300 includes a plasma processing chamber 302, which is defined by a chamber wall 303. Chamber wall 303 is preferably formed from a material that is substantially resistant to etching by a plasma present within the chamber during processing. To provide an electrical path to ground, the chamber wall 303 of chamber 302 is typically grounded. Above chamber 302, there is disposed an antenna 304 (represented by a coil). Antenna 304 is powered by a first RF power source 306 via a matching network (not shown in FIG. 3 to simplify the illustration). Preferably, a dielectric window 308 is disposed below inductive electrode 304.

Typically, a gas injector 310 is provided within chamber 302. Gas injector 310 is preferably disposed around the inner periphery of chamber 302 and is arranged for releasing gaseous source materials, e.g., the etchant source gases, into the RF-induced plasma region between dielectric window 308 and a substrate 312. Alternatively, the gaseous source materials may also be released from ports built into the walls of the chamber itself or through a shower head arranged in the dielectric window. Substrate 312 is introduced into chamber 302 and disposed on a chuck 314, which acts as a bottom electrode and is preferably biased by a second RF power source 316 (also typically via a matching network). Furthermore, chuck 314 may optionally include a focus ring 317, preferably made from a ceramic material such as aluminum oxide, positioned around the bottom electrode. Chuck 314 may represent, for example, an ESC (electrostatic) chuck, which secures substrate 312 to the chuck's surface by electrostatic force.

Still referring to FIG. 3, an exhaust port 318 is typically disposed around chamber 302. Exhaust port 318 is coupled to a turbomolecular pump (not shown), typically located outside of chamber 302. For the most part, the turbomolecular pump maintains the appropriate pressure inside chamber 302. Although, the high density, inductively coupled reactor is employed as the preferred apparatus for forming conducting lines and has shown particularly good results, any plasma reactor that is suitable for forming a plasma, such as a capacitively coupled or ECR reactor, may be used.

Correspondingly, in order to create a plasma, a process gas is input into chamber 302 through gas injector 310. Power is then supplied to antenna 304 using first RF power source 306, and a large electric field is produced inside chamber 302. The electric field accelerates the small number of electrons present inside the chamber causing them to collide with the gas molecules of the process gas. These collisions result in ionization and initiation of a discharge or plasma 320. As is well known in the art, the neutral gas molecules of the process gas when subjected to these strong electric fields lose electrons, and leave behind positively charged ions. As a result, positively charged ions 322 and negatively charged electrons 324 are contained inside plasma 320. Furthermore, neutral gas molecules 326 (and/or atoms) are contained inside plasma 320 and throughout chamber 302.

To further discuss the features of the inventions and their advantages over the prior art, FIG. 3 illustrates plasma processing reactor 300 with a uniformity ring 350 that is disposed above bottom electrode (or chuck) 314, in accordance with one aspect of the present invention. Preferably, uniformity ring 350 is stationary with respect to the plasma processing reactor and is coupled to a portion of the chamber (e.g., chamber walls 303, dielectric window 308, and/or bottom electrode 314). In FIG. 3, uniformity ring 350 is shown coupled to chamber walls 302 with a support member 352. Additionally, uniformity ring 350 is preferably configured to block a substantial amount of reactants, which are located in region 353 proximate the edge of substrate 312 from contacting the substrate edge.

Preferably, support member 352 is configured to place uniformity ring 350 above and in a spaced apart relationship with bottom electrode 314. The spaced apart relationship is configured to provide a vertical space 354 for the ingress and egress of substrate 312. By way of example, a substrate is transferred by a handler (i.e., robot arm with a fork) that moves the substrate horizontally through vertical space 354. Once the substrate is in position above the bottom electrode, a pin (not shown), disposed inside the bottom electrode and moving vertically, picks up the substrate from the handler. The handler then retracts and the pin drops leaving the substrate disposed on the bottom electrode in position for processing. Typically, the chuck is activated to hold the substrate in place. Advantageously, the substrate may be inputted through the space from almost any direction, and therefore the uniformity ring of the present invention may be used to retrofit existing plasma processing systems.

Furthermore, the bottom surface of uniformity ring 350 is evenly spaced from the top surface of bottom electrode 314 (e.g., parallel). In this manner, neutral reactants 356 are distributed evenly around the substrate and therefore a more uniform etch rate is achieved. However, it should be noted that the support member may disturb the flow of gases around the substrate and therefore the support member is preferably placed away from the exhaust path or if in the exhaust path, as far away from the substrate as possible, to ensure the even distribution of gases at the surface of the substrate. That is, the support member should not create a barrier near the periphery of the substrate. A barrier may impede the flow of gases which may lead to non-uniform etch rates and particle contamination along the periphery of the substrate. Correspondingly, it is preferable for the support member to be as small as possible, while still having the strength to support the uniformity ring. In a preferred embodiment, the width (i.e., diameter) of the support member is about 1/8 to about 1/4 of an inch. Additionally, the support member is preferably positioned such that it does not interfere with the ingress and egress of the substrate.

In one embodiment, three support members are used to hold the uniformity ring in the spaced apart relationship. However, it should be noted that the invention is not limited by three support members and that any number of support members may be used so long as they provide support to the uniformity ring. In a preferred embodiment, the support member is coupled to the chamber side walls. In this embodiment, the space, formed by the spaced apart relationship, has no impediments to the flow of gases. In another embodiment, the support members are coupled to the bottom electrode. In yet another embodiment, the support members are coupled to the dielectric window above the uniformity ring.

Moreover, the uniformity ring is preferably configured to be removably coupled to the support members. In one embodiment, the uniformity ring includes a hole or notch (or slot) for mating with the support member (not shown). The hole is configured to keep the uniformity ring in a spaced apart relationship. Correspondingly, the uniformity ring is easily removable from the processing chamber. Removing the uniformity ring enables the plasma reactor to have less downtime because a clean uniformity ring can be placed in the chamber while the dirty one is cleaned.

In addition to providing a space for the ingress and egress of a substrate, space 354 is used to remove etched by-products 358, formed during etching, from the surface of substrate 312. Typically, if no space is provided a portion of the etched byproducts will deposit onto the side walls of the uniformity ring near the periphery of substrate 312. As mentioned, side wall deposition may lead to particle contamination. By providing a space, less material will deposit on the uniformity ring and, as a result, yield problems associated with particle contamination will be reduced. Furthermore, substrate throughput may be increased because the uniformity ring will not have to be cleaned as often.

While not wishing to be bound by theory, it is also believed that the etch rate is determined by how fast the species are brought to the substrate and how fast the resultant gases are taken out. By providing a space proximate to the substrate edge, the by-products may be removed relatively quickly and efficiently from about the surface of the substrate and, as a result, the etch rate may be increased.

In a preferred embodiment, the spaced apart relationship is dimensioned to provide a vertical space for the ingress and egress of the substrate and a space for exhausting by-product gases and particles, while substantially blocking the edge of the substrate from high density neutral reactants that are located at the outer periphery of the uniformity ring. Preferably, the vertical space provides a distance of between about 1/2 to 3/8 of an inch.

Furthermore, uniformity ring 350 is configured to surround the periphery of substrate 312. Therefore, the uniformity ring has an opening 360 that provides a passage for the species to diffuse downward from the plasma region 320 above to the surface of substrate 312. Typically, opening 360 defines the inner peripheral surface of the uniformity ring. Preferably, opening 360 is configured to direct a species uniformly to the surface of the substrate. When the density of the plasma is controlled and confined through opening 360, the etching tends to be more uniform. For the most part, a straight vertical wall will tend to give better etch results because the straight wall will tend to produce a more uniform plasma flow (e.g., ions) to the surface of the substrate. Therefore, it is preferable to have the inner peripheral surface of the uniformity ring be perpendicular to the bottom electrode. However, it should be noted that the inner peripheral surface may include a taper to direct the plasma (e.g., ions) in greater or lesser amounts to the substrate surface, if needed. For example, a positively sloped taper will direct a greater concentration of ions to the edge of the substrate and a negatively sloped taper will direct a lesser concentration of ions to the edge of the substrate.

Still further, the opening of the uniformity ring has a shape that coincides with the shape of the substrate. Typically, the substrate is circular and therefore it is preferable to have an opening with a circular cross section. This tends to produce a more uniform etch. In one embodiment, the diameter of the opening is greater than or equal to about 12 inches for a substrate size of about 12 inches. However, it should be noted that the present invention is not limited to a particularly sized substrate and that any sized substrate may be used. Accordingly, the diameter of the opening is preferably greater than or equal to the size of the substrate. For the most part, the more symmetrical the uniformity ring is with respect to the periphery of the substrate, the more uniform the etch. Therefore, in one embodiment, the uniformity ring is an annular ring.

Additionally, a gap 370 is preferably provided between the inner peripheral surface of uniformity ring 350 and the outer periphery of substrate 312. In a preferred embodiment the gap is about 1/2 of an inch. While not wishing to be bound by theory, it is believed that having a gap will tend to minimize the dissipation of the ions to the substrate (better to adjust the ion flow). Furthermore, it should be noted that a larger gap tends to be less effective at blocking the neutral reactants at the edge of the substrate and that a smaller gap tends to be more effective at blocking neutral reactants at the edge of the substrate. Therefore, depending on the process employed, the gap may be increased or decreased as needed.

The height of the inner peripheral surface of the uniformity ring has a similar impact on the species delivered to the substrate. For example, as the uniformity ring increases in height, the neutral reactants density at the substrate edge is reduced. Additionally, as the uniformity ring increases in height, the ion density reaching the substrate edge is adversely impacted. Therefore, a height that balances the ion density and the neutral reactants density is used. In a preferred embodiment, the height of the uniformity ring is about 1/2 to about 1 1/2 of an inch.

Moreover, uniformity ring 350 has a thickness 380 configured to substantially prevent diffusion of the species through space 354. By increasing the thickness, the amount of neutral reactants flowing through space 354 will tend to be reduced and therefore a decreased amount of neutral reactants will diffuse into edge of the substrate. Preferably, the thickness is configured to be as large as possible. In one embodiment, the thickness is greater than or equal to about 1/2 of an inch. In a preferred embodiment, the thickness is about 1 inch.

The thickness of the uniformity ring is limited, however, by the need to leave some area open for pumping. For the most part, the open area should be configured to allow the turbomolecular pump to effectively remove the exhaust by-product gases and maintain the desired chamber pressure. A distance 390 between the chamber wall and the uniformity ring is dimensioned to provide this open area. Preferably, the distance 390 is configured to form an exhaust port area (e.g., area between the outside perimeter uniformity ring and the inside perimeter of the chamber walls) that is greater than or equal to the area of the opening of the pumping arrangement. In a preferred embodiment, the distance is about 2.5 inches. Moreover, it should be noted that the uniformity ring may be configured to extend to the side walls of the chamber, if openings are provided for exhausting by-product gases and maintaining the desired chamber pressure.

Figure 4:
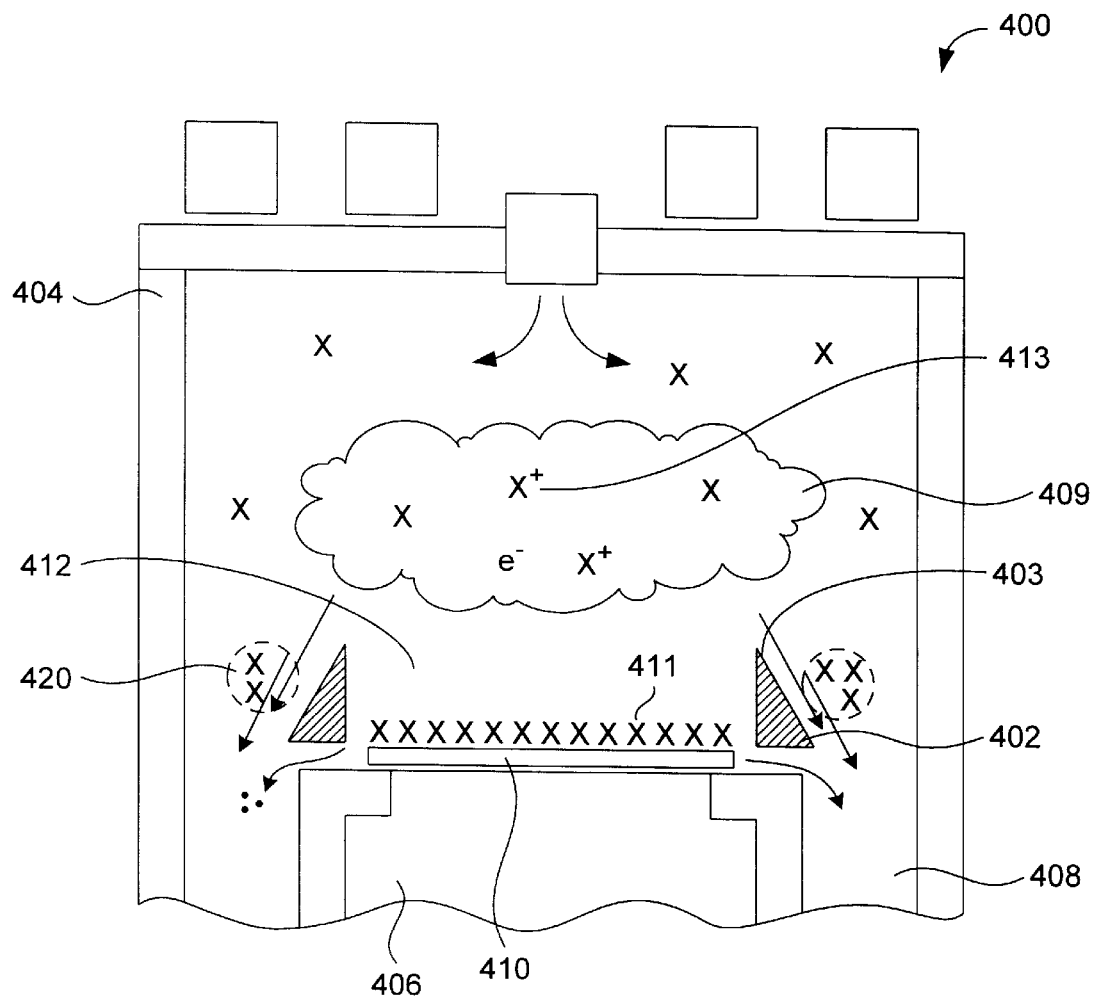
FIG. 4 is a schematic diagram of an inductive plasma processing reactor with a stationary uniformity ring that has a tapered outer peripheral surface, in accordance with one embodiment of the present invention.

In another preferred embodiment, the uniformity ring includes a taper along the outer peripheral surface. In this embodiment, the taper creates a flow in a direction away from the interior of the uniformity ring. This flow tends to cause more species to be diverted to the outside of the uniformity ring, thereby reducing the amount of reactants delivered to the edge of the substrate during processing. To facilitate discussion of this aspect of the present invention, FIG. 4 shows a uniformity ring 402 with a taper 403 inside a plasma processing reactor 400. The plasma processing reactor 400 includes a chamber wall 404, a bottom electrode 406, and an exhaust port 408, which respectively correspond to the chamber wall 303, the bottom electrode 314, and the exhaust port 318 illustrated in FIG. 3. Preferably, taper 403 is configured on the outer peripheral surface of uniformity ring 402 and provides a slope that extends outward towards chamber wall 404.

When a process gas is inputted into the chamber and a plasma 409 is formed, the species (e.g., ions, electrons and neutral reactants) within the chamber are directed towards the substrate in a variety of ways. For example, neutral species 411 tend to move to the surface of the substrate by diffusion or convection and ions 413 tend to move to the surface of the substrate by attraction (e.g., potential). For the most part, when these species encounter the tapered uniformity ring 402, a first portion of these species are directed towards a substrate 410 through opening 412 in the uniformity ring 402 and a second portion are directed towards exhaust port 408 along taper 403. In this manner, a portion of the species are driven in a direction away from the substrate and therefore the neutral reactants density at edge of substrate, more particularly region 420, is reduced. Furthermore, the tapered profile helps to maximize the pumping of the species through exhaust port 408.

Moreover, the tapered surface advantageously reduces the amount of corners and surface area that are typically found on the uniformity ring. Typically, corners and surface area form areas that collect by-product deposits (e.g., polymers). As is well known in the art, increased deposits may lead to a greater risk of particle contamination and reduce substrate throughput due to increased uniformity ring cleaning.

Figure 5:
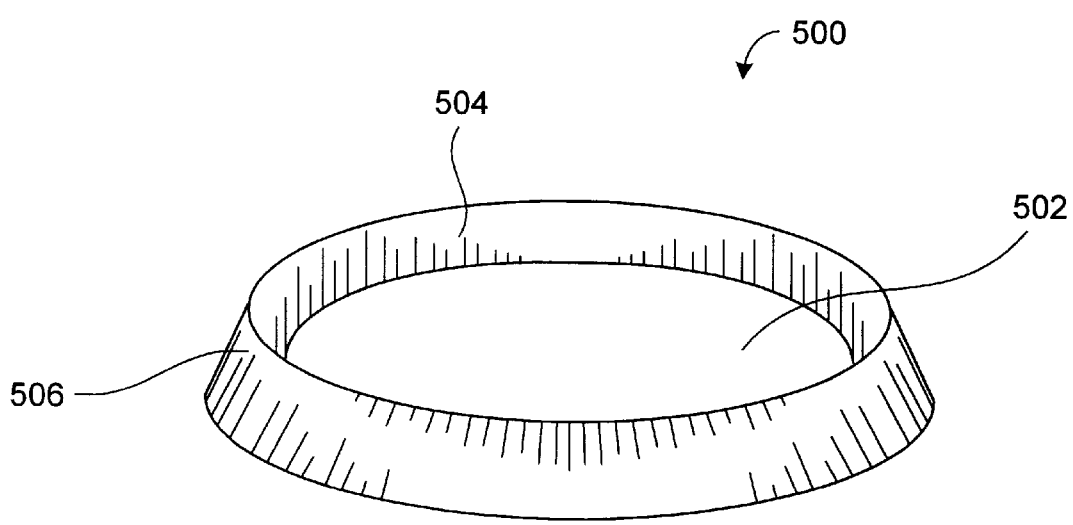
FIG. 5 is a perspective view of a preferred configuration of the uniformity ring, in accordance with one embodiment of the present invention.

To elaborate further, FIG. 5 is a perspective view of a preferred configuration of a tapered uniformity ring 500, in accordance with one embodiment of the present invention. Tapered uniformity ring 500 may be uniformity ring 402 of FIG. 4. Tapered uniformity ring 500 includes an opening 502 that defines an inner peripheral surface 504 of uniformity ring 500. Inner peripheral surface 504 is preferably a vertical wall. Furthermore, opening 502 is configured to surround the periphery of the substrate. Although not shown, the bottom surface of the uniformity ring is configured to be horizontal. Additionally, tapered uniformity ring 500 includes a taper 506.

In another preferred embodiment, the uniformity ring is preferably formed from a material that is substantially resistant to etching by the plasma present within the chamber (e.g., inert to the reactive species). The uniformity ring should be formed of a material that is able to withstand the plasma environment without unduly contaminating the substrate. In one embodiment, ceramics materials are preferably employed. In another embodiment, materials such as SiC, Aluminum oxide, quartz or Vespel® by Dupont Chemical Corporation of Delaware may be used. Furthermore, the uniformity ring may be formed of a different material entirely with a coating of the above mentioned materials. Moreover, the support member may be formed in a similar manner.

In one specific application of this invention a 12 inch substrate having thereon an aluminum layer (e.g., a conductive layer) is etched in the aforementioned plasma processing reactor system. The mask material represents a photoresist layer and the etchant includes a chlorine-containing gas (e.g., a chlorine gas such as $Cl_2$). However, this invention is not limited to a particular sized substrate, a particular conductive layer, a particular mixture of gases, a particular set of processing parameters, and/or a particular plasma chamber.

The pressure within the aforementioned plasma processing reactor system is preferably maintained from about 7 milliTorr (mT) to about 20 mT, and more preferably at about 10 mT during etching. The top RF antenna power is preferably maintained from about 500 watts (W) to about 2000 W, and more preferably at about 1000 W during etching. The bottom electrode power is preferably maintained from about 100 watts (W) to about 300 W, and more preferably at about 250 W during etching. Additionally, the gap between the antenna and the bottom electrode is about 6.5 inches. Furthermore, $Cl_2$ is flowed into the processing chamber at about 120 standard cubic centimeters per minute (sccm), $BCl_3$ is flowed at about 80 sccm, and $N_2$ is flowed at about 30 sccm.

It should be noted, however, that the flow rates of the component source gases may be scaled as needed when smaller or larger substrates are involved. Thus, while the relative flow rate among the various component gases (which may be expressed as a percentage of one particular gas flow rate) is important, the absolute flow rate for each component gas may be modified as needed to accommodate different substrate sizes. Additionally, both RF power source levels may be optimized to achieve a suitable overall etch rate, photoresist selectivity, and to maintain the desired etch profile in a given system and/or for a given substrate stack.

In an alternate embodiment, the uniformity ring is heated to provide a uniform temperature throughout the etching process and to reduce the amount of polymer build up on the surfaces of the uniformity ring. For the most part, the cooler the area, the more deposition that is likely to occur. Therefore, the uniformity ring is preferably configured to be hot enough to prevent polymer deposition on the side walls of the uniformity ring. Furthermore, once a set of process parameters has been determined, it is preferable to maintain them from etch to etch. For the most part, process drift adversely effects the etch results. Therefore, it is preferable to keep the temperature of the uniformity ring constant for processing, to obtain better control.

To further elaborate, the uniformity ring may be heated by conduction or radiation. This may be implemented by heating coils (e.g., electrically), heating lamps, fluid passages, and the like, inside or outside the uniformity ring. In one embodiment, the support member is configured to supply heat to the uniformity ring. In this embodiment, the heater conducts heat through the support member to the uniformity ring. Furthermore, because of fatigue problems, the uniformity ring may include flexures for allowing thermal expansion. In another embodiment, the temperature of the uniformity ring is automatically controlled. For example, when the plasma is charged, the heat inside the chamber generally rises, and therefore the controller is designed to reduce heater power in order to maintain the proper temperature. Correspondingly, heat is generated by the heater when there is no plasma.

As can be seen from the foregoing, the present invention offers numerous advantages over the prior art. By way of example, the invention provides a stationary uniformity ring that is configured for the ingress and egress of substrates. Correspondingly, the stationary uniformity ring substantially prevents diffusion of neutral reactants at the periphery of the substrate during processing and therefore uniform etch rates are achieved. Furthermore, the present invention provides a space at about the surface of the substrate for removing unwanted by-products produced during etching. As a result, particle contamination is reduced and a more efficient etch reaction is obtained.

Additionally, the present invention offers a simple design that makes it easy to manufacture and clean. For example, the uniformity ring is an annular ring without slits or openings (e.g., more surface area and more corners) through the side walls. Moreover, by not having slits or openings in the side walls of the uniformity ring, and further being evenly spaced from the substrate, a symmetrical gas flow around the surface of the substrate is produced, which as result produces a more uniform etch rate. Still further, the present invention is easily removable and therefore can be cleaned without impacting substrate throughput.

While this invention has been described in terms of several preferred embodiments, there are alterations, permutations, and equivalents which fall within the scope of this invention. It should also be noted that there are many alternative ways of implementing the methods and apparatuses of the present invention. It is therefore intended that the following appended claims be interpreted as including all such alterations, permutations, and equivalents as fall within the true spirit and scope of the present invention.

What is claimed is:

1. A plasma processing reactor for processing a semiconductor substrate, comprising:
    a chamber, said chamber including a bottom electrode, said bottom electrode being configured for holding said substrate; and
    a stationary uniformity ring being configured to surround the periphery of said substrate, said stationary uniformity ring being coupled to a portion of said chamber and disposed above said bottom electrode in a spaced apart relationship to form a vertical space above said bottom electrode, said vertical space being configured to provide room for ingress and egress of said substrate, said stationary uniformity ring having a thickness that substantially reduces diffusion of a first species from outside said stationary uniformity ring toward an edge of said substrate, said stationary uniformity ring having an outer peripheral surface that is spaced apart laterally from a chamber wall thus leaving an open area between said stationary uniformity ring and said chamber wall, said open area permitting gases to pass from above said stationary uniformity ring to an exhaust port.

2. The plasma processing reactor of claim 1, wherein said vertical space is further configured for removing etched by-products produced during said processing.

3. The plasma processing reactor of claim 1 wherein said uniformity ring is coupled to the side walls of said chamber.

4. The plasma processing reactor of claim 1 wherein said vertical space is about ½ of an inch to about ⅜ of an inch.

5. The plasma processing reactor of claim 1 wherein said stationary uniformity ring is formed from a material that is substantially resistant to etching by a plasma present within said chamber during said processing.

6. The plasma processing reactor of claim 5 wherein said stationary uniformity ring is formed from a ceramic material.

7. The plasma processing reactor of claim 5 wherein said stationary uniformity ring is formed from a material selected from the group consisting of SiC, Aluminum oxide, quartz or Vespel®.

8. The plasma processing reactor of claim 1 wherein said uniformity ring is coated with a material that is substantially resistant to etching by a plasma present within said chamber during said processing.

9. The plasma processing reactor of claim 1 wherein the inner periphery of said stationary uniformity ring has a shape that coincides with a shape of said substrate.

10. The plasma processing reactor of claim 1 wherein the inner periphery of said stationary uniformity ring has a circular shape.

11. The plasma processing reactor of claim 1 wherein the inner periphery of said stationary uniformity ring has a diameter of greater than or equal to about 12 inches.

12. The plasma processing reactor of claim 1 wherein the inner periphery of said stationary uniformity ring is perpendicular with said bottom electrode.

13. The plasma processing reactor of claim 1 wherein said stationary uniformity ring is parallel with said bottom electrode.

14. The plasma processing reactor of claim 1 wherein the inner peripheral surface of said stationary uniformity ring is spaced apart from the periphery of said substrate.

15. The plasma processing reactor of claim 1 wherein said stationary uniformity ring has a height, which is defined by a bottom surface and a top surface of said stationary uniformity ring, and which is at least partially arranged to control an amount of said first species distributed to said substrate during said processing.

16. The plasma processing reactor of claim 15 wherein said height of said stationary uniformity ring is between about ½ of an inch and about 1½ inches.

17. The plasma processing reactor of claim 1 wherein said thickness is greater than or equal to ½ of an inch.

18. The plasma processing reactor of claim 1 wherein said stationary uniformity ring is an annular ring.

19. The plasma processing reactor of claim 1 wherein the outer peripheral surface of said uniformity ring is tapered, wherein said taper provides a diffusion barrier that reduces an amount of said first species delivered to the edge of said substrate during said processing by directing a portion of said first species in a direction away from the edge of said substrate.

20. The plasma processing reactor of claim 1 wherein said uniformity ring is positioned in said spaced apart relationship by a support mechanism that is disposed substantially outside an exhaust path of by-products formed during said processing.

21. A plasma reactor for processing a substrate, comprising:
    a chamber having a chamber wall;
    a pedestal disposed inside said chamber for supporting said substrate; and
    a stationary uniformity ring disposed inside said chamber and having a first peripheral surface and a second peripheral surface, the first peripheral surface being spaced apart from the chamber wall to form a first passage, and the second peripheral surface being spaced apart from the pedestal to form a second passage, the first and second passages being arranged for permitting gases to pass therethrough.

22. The plasma reactor as recited in claim 21 wherein said second passage is configured for providing room for an ingress and egress of said substrate.

23. The plasma reactor as recited in claim 22 wherein said uniformity ring substantially reduces diffusion of a first species associated with said processing proximate the edge of said substrate.

24. The plasma reactor as recited in claim 22 wherein said uniformity ring is coupled to a portion of said chamber.

25. The plasma reactor as recited in claim 22 wherein said uniformity ring has a third peripheral surface positioned opposite said first peripheral surface, the third peripheral surface being configured to surround the periphery of said substrate.

26. The plasma reactor as recited in claim 25 wherein said second peripheral surface is positioned between said first peripheral surface and said third peripheral surface, and wherein said third peripheral surface is substantially perpendicular to a top surface of said pedestal during said processing and wherein said second peripheral surface is parallel to said top surface of said pedestal during said processing.

27. The plasma reactor as recited in claim 25 wherein said third peripheral surface is vertical, and wherein said first peripheral surface is sloped.

28. A uniformity ring for use in a plasma reactor for processing a substrate, the plasma reactor including a chamber and a pedestal for supporting said substrate, said uniformity ring, comprising:

a vertical inner peripheral wall configured to surround the periphery of said substrate;

a sloped outer peripheral wall positioned opposite said inner peripheral wall, the sloped outer peripheral wall being adapted to be spaced apart from the chamber during said processing thereby permitting gases to pass therebetween; and a bottom wall positioned between said vertical inner peripheral wall and said sloped outer peripheral wall, the bottom wall being adapted to be spaced apart from the pedestal during said processing thereby permitting gases to pass therebetween.

\* \* \* \* \*